United States Patent
Mukaiyama et al.

(10) Patent No.: US 8,134,221 B2
(45) Date of Patent: Mar. 13, 2012

(54) INDUCTOR AND FILTER

(75) Inventors: Kazutaka Mukaiyama, Yasu (JP); Hiroshi Kawai, Moriyama (JP); Naoto Yatani, Moriyama (JP); Makoto Inai, Otsu (JP); Akinori Hamada, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 311 days.

(21) Appl. No.: 12/467,420

(22) Filed: May 18, 2009

(65) Prior Publication Data

US 2010/0006977 A1   Jan. 14, 2010

(30) Foreign Application Priority Data

Jul. 11, 2008   (JP) ................. 2008-180970

(51) Int. Cl.
*H01L 29/20* (2006.01)
(52) U.S. Cl. ............... 257/531; 257/E29.089; 257/528; 257/E29.001
(58) Field of Classification Search ........... 257/531
See application file for complete search history.

(56) References Cited

U.S. PATENT DOCUMENTS

| | | |
|---|---|---|
| 3,890,636 A | 6/1975 | Harada et al. |
| 5,034,799 A | 7/1991 | Tomita et al. |
| 6,504,189 B1 | 1/2003 | Matsuda et al. |
| 2006/0125589 A1 | 6/2006 | Tamata et al. |
| 2006/0208832 A1* | 9/2006 | Kamata et al. ............ 333/174 |
| 2007/0045773 A1 | 3/2007 | Mi et al. |

FOREIGN PATENT DOCUMENTS

| | | |
|---|---|---|
| JP | 48-034686 A | 5/1973 |
| JP | 02-220464 A | 9/1990 |
| JP | 04-290212 A | 10/1992 |
| JP | 05-190333 A | 7/1993 |
| JP | 2000-036496 A | 2/2000 |
| JP | 2001-267512 A | 9/2001 |
| JP | 3450713 B2 | 9/2003 |
| JP | 2004-214414 A | 7/2004 |
| JP | 2006-173145 A | 6/2006 |
| JP | 2006-339197 A | 12/2006 |
| JP | 2007-067236 A | 3/2007 |

OTHER PUBLICATIONS

Official Communication issued in corresponding Japanese Patent Application No. 2008-180970, mailed on Apr. 20, 2010.
Official Communication issued in corresponding Chinese Patent Application No. 200910141064.2, mailed on Mar. 14, 2011.

* cited by examiner

*Primary Examiner* — N Drew Richards
*Assistant Examiner* — Mamadou Diallo
(74) *Attorney, Agent, or Firm* — Keating & Bennett, LLP

(57) ABSTRACT

An inductor includes a first air-bridge section and a second air-bridge section. The first air-bridge unit extends in a floating location over a substrate between a plurality of support locations on the substrate. The second air-bridge unit extends in a floating location over the first air-bridge unit between a plurality of support locations on the first air-bridge unit. This arrangement enables the first and second air-bridge sections to be connected in parallel, thus branching a flowing current. Thus, the conductor loss in each of the first and second air-bridge sections is reduced.

4 Claims, 5 Drawing Sheets

INDUCTOR AND FILTER

BACKGROUND OF THE INVENTION

1. Field of the Invention

The present invention relates to an inductor used for radio communications in microwave and millimeter wave bands or transmission and reception of electromagnetic waves, and to a filter including the inductor.

2. Description of the Related Art

Inductors having an air-bridge structure are disclosed in Japanese Patent No. 3450713 and Japanese Unexamined Patent Application Publication No. 2007-67236. Such an inductor has an electrode that is partially floating from a substrate thereof.

The inductor disclosed in Japanese Patent No. 3450713 has an air-bridge structure in which a conductor pattern having a chevron cross-sectional shape floats from a substrate in order to increase the cross-sectional area of the conductor pattern.

The inductor disclosed in Japanese Unexamined Patent Application Publication No. 2007-67236 has an air-bridge structure in which a first layer conductor pattern and a second layer conductor pattern laminated on a substrate are serially connected.

Although these inductors ideally have only an inductance component, the actual circuit thereof has a resistance component and causes a resistance loss. As the inductor gets closer to a pure inductance, the Q value of the inductor increases. A large Q value inductor is preferable. The Q value of the inductor is expressed by the following equation:

$$Q=\omega L/r$$

where $\omega$ represents an operating frequency (angular frequency), L represents an inductance component L, and r represents a resistance component.

In high-frequency bands, such as microwave and millimeter wave bands, current distribution (skin effect) is pronounced within a conductor, and the skin effect of an electrode increases the resistance component. For example, if a gold electrode is used in the 2 GHz band, the skin depth is $\delta s$=about 1.7 µm, which is less than a thickness of an electrode made of typical plate (for example, about 6 µm or greater). Current is concentrated in an electrode subsurface portion to as thick as about 1.7 µm, thereby increasing the resistance component r of the inductor.

The inductor disclosed in Japanese Patent No. 3450713 has a conductor with an increased cross-sectional area. Because of the skin effect, an increase in the cross-sectional area of the conductor does not significantly contribute to controlling an increase in the resistance component r. Accordingly, the Q value of the inductor cannot be sufficiently increased as would be expected.

In accordance with Japanese Unexamined Patent Application Publication No. 2007-67236, the serial connection of the first layer conductor pattern and the second layer conductor pattern increases a total inductance value L, thereby increasing the Q value of the inductor. However, with this arrangement, a large air gap is required to control parasitic capacity. A coil at a top tier must be mounted at a high level position above the substrate as compared to the thickness of an electrode. Thus, miniaturization (low-profile design) is difficult to achieve. Furthermore, the coil at the top tier is permitted to be connected to a coil at a lower tier at only one point, and the structural strength of the inductor cannot be maintained at a sufficient level.

SUMMARY OF THE INVENTION

To overcome the problems described above, preferred embodiments of the present invention provide an inductor having a high structural strength and a high Q value, and a filter including the inductor.

An inductor according to a preferred embodiment of the present invention includes a first air-bridge electrode and a second air-bridge electrode. The first air-bridge electrode extends between a plurality of support locations on a substrate in a floating arrangement with respect to the substrate. The second air-bridge electrode extends between a plurality of support positions on the first air-bridge electrode in a floating arrangement with respect to the first air-bridge electrode.

With this arrangement, the first air-bridge electrode and the second air-bridge electrode are connected in parallel. A total surface area of the first and second air-bridge electrodes is increased. Even if the skin effect is produced, the concentration of current is reduced. An increase in the resistance component is effectively controlled, and the Q value of the inductor is increased. Since the first and second air-bridge electrodes are supported at the plurality of locations, the structural strength of the inductor is increased.

Each of the first air-bridge electrode and the second air-bridge electrode may preferably have a thickness greater than a skin depth at an operating frequency of the inductor. In the inductor that includes only one air-bridge electrode, the skin effect may cancel out the improvement in the Q value even if the electrode thickness is set to be greater than the skin depth at the operating frequency of the inductor. In accordance with preferred embodiments of the present invention, the large surface area reduces the current concentration, and a high Q value inductor is produced.

The support location of the second air-bridge electrode may preferably be aligned with the support location of the second air-bridge electrode. Thus, the structural strength of the inductor is further increased.

The support location of the second air-bridge may preferably be deviated from the support location of the first air-bridge electrode. With this arrangement, the shape of the second air-bridge electrode on the support location is planarized. If the second air-bridge electrode sags downward at the support location toward the substrate, the surfaces of the electrodes are moved closer to each other at the sagging portion, and a radiated magnetic field is concentrated. As a result, radiation loss increases. If the electrode has a flat structure, such a loss is effectively controlled.

The substrate may preferably include a gallium arsenide (GaAs) semiconductor substrate, for example. The gallium arsenide substrate has a small tan delta ($\delta$), and the loss caused by the substrate is decreased.

A filter according to a preferred embodiment of the present invention includes the inductor. With the resistance component reduced in the inductor, a filter having a low insertion loss is provided.

In accordance with various preferred embodiments of the present invention, the first air-bridge electrode and the second air-bridge electrode are connected in parallel, and the concentration of current is reduced. Accordingly, the inductor has a high Q value and a high structural strength.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention are described below with reference to the drawings.

Figure 1A:
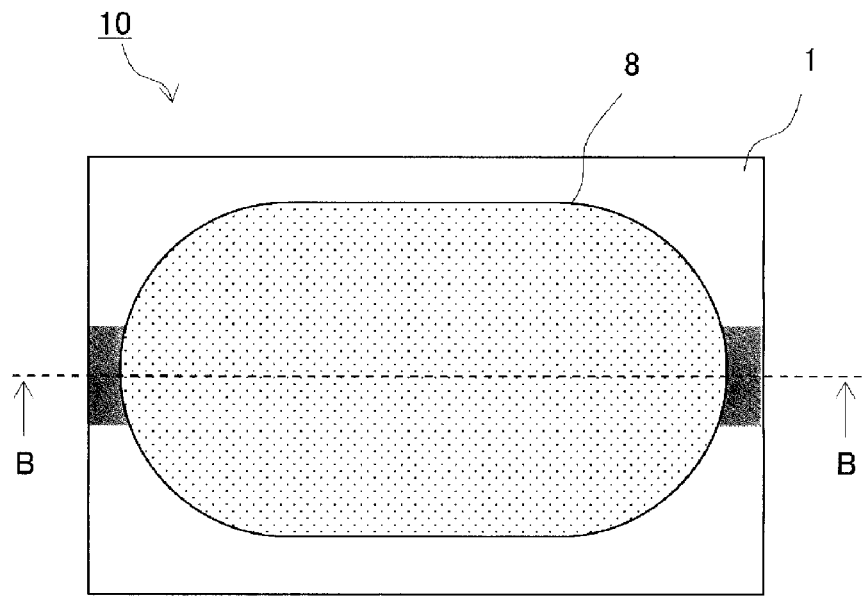
FIGS. 1A to 1C illustrate an inductor in accordance with a first preferred embodiment of the present invention.
Figure 1B:
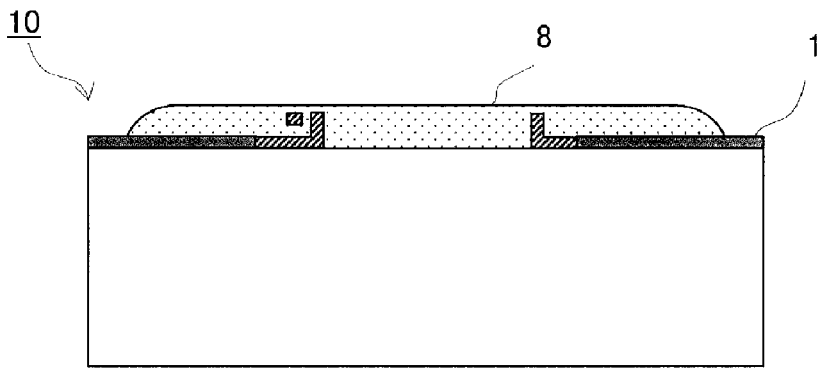
Figure 1C:
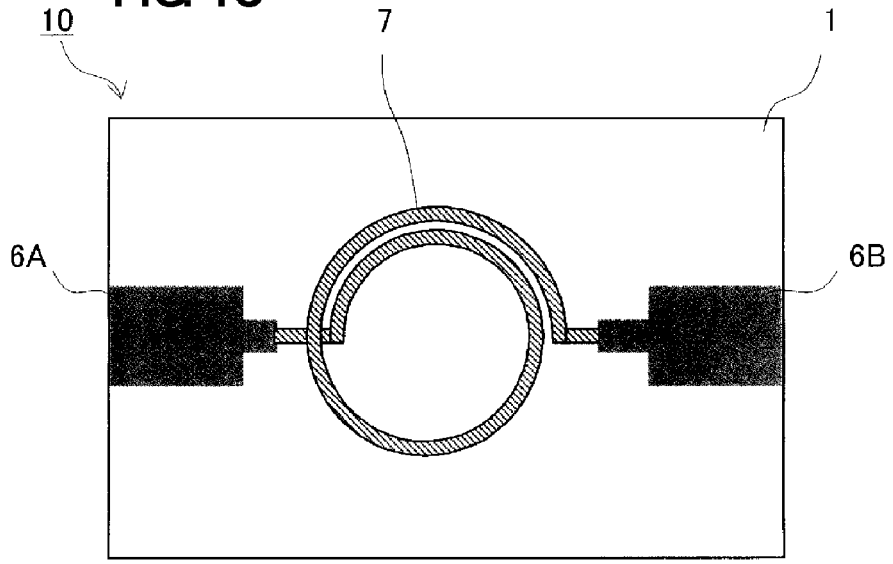

FIGS. 1A to 1C illustrate an inductor 10 in accordance with a first preferred embodiment of the present invention. FIG. 1A is a top view of the inductor 10, FIG. 1B is a sectional view of the inductor 10 taken along B-B in FIG. 1A, and FIG. 1C is a plan view of a top of a substrate 1.

The inductor 10, preferably operating in the 2 GHz band, includes the substrate 1, a resin layer 8, an inductor element 7, and terminal electrodes 6A and 6B. The substrate 1 is preferably a gallium arsenide substrate having a specific dielectric constant $\epsilon_r$=about 12.9, a dielectric loss tangent tan $\delta$=about $2.4 \times 10^{-4}$, and a thickness of about 100 μm, for example. The inductor element 7 is preferably a spiral conductor pattern having an inner diameter of about 300 μm, the number of winding of about 1.5, and an electrode width of about 30 μm, for example. The resin layer 8 is preferably made of an insulating resin material such as polyimide (PI) or benzocyclobutene (BCB), for example. The resin layer 8 having a thickness of about 25 μm is preferably disposed in an area covering a formation area of the inductor element 7. The terminal electrodes 6A and 6B are respectively connected to both ends of the inductor element 7.

Figure 2A:
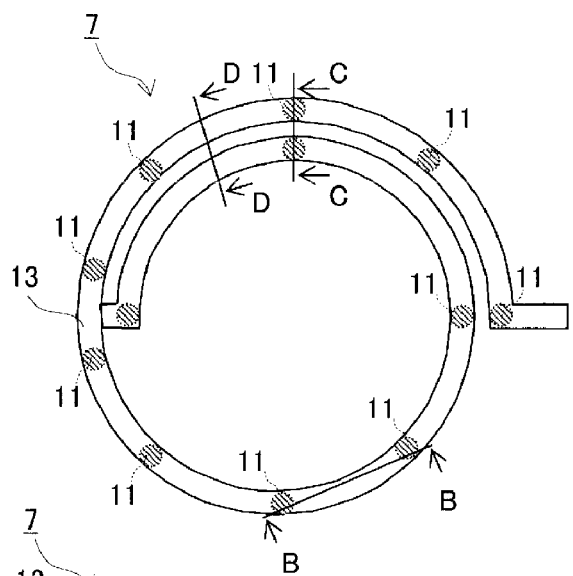
FIGS. 2A to 2D illustrate an inductor element of the inductor in accordance with the first preferred embodiment of the present invention.
Figure 2B:
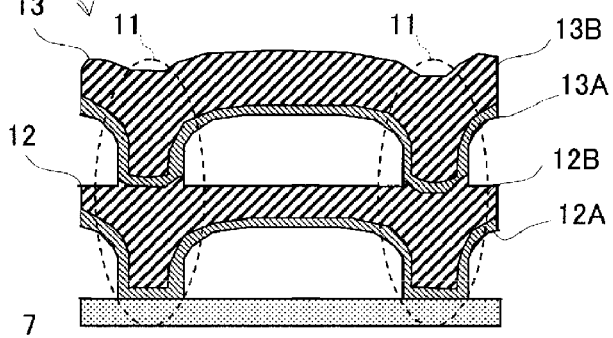
Figure 2C:
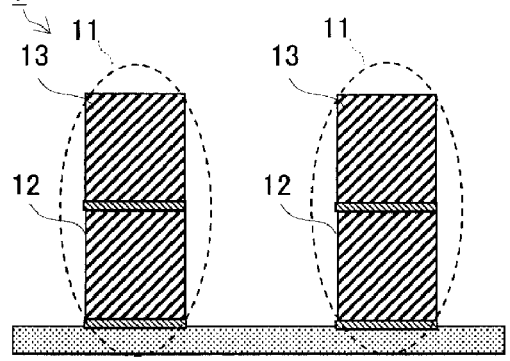
Figure 2D:
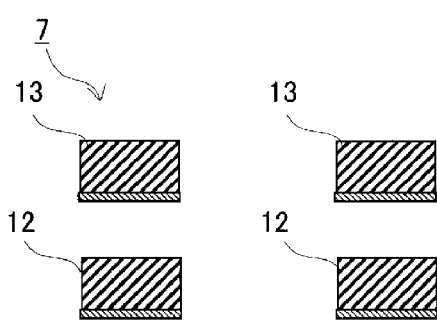

FIGS. 2A to 2D illustrate the inductor element 7 in the inductor 10. FIG. 2A is an expanded plan view of the inductor element 7. FIG. 2B is a sectional view of the inductor element 7 taken along line B-B in FIG. 2A. FIG. 2C is a sectional view of the inductor element 7 taken along line C-C in FIG. 2A. FIG. 2D is a sectional view of the inductor element 7 taken along line D-D in FIG. 2A.

The inductor element 7 includes an air-bridge section 12 and an air-bridge section 13, laminated in a substantially vertical direction to the substrate 1. Each of the air-bridge sections 12 and 13 preferably has an electrode thickness of about 6 μm and an average air spacing of about 4 μm, for example. The air-bridge sections 12 and 13 include seed layers 12A and 13A, and plate layers 12B and 13B. The seed layers 12A and 13A and the plate layers 12B and 13B are preferably produced through a thin-film fine processing technique, such as photolithography, for example. The seed layers 12A and 13A are preferably made of titanium, for example, and the plate layers 12B and 13B are preferably made of gold having $\delta = 4.1 \times 10^{-7}$ S/m, for example.

The air-bridge section 12 and the air-bridge section 13 has an electrode structure as illustrated in FIGS. 2A to 2D. More specifically, the air-bridge section 13 is electrically connected to the air-bridge section 12 at support locations 11 thereof, and floats above the air-bridge section 12 at the remaining portions thereof. The air-bridge section 12 is connected to the substrate at the support locations 11, and floats above the substrate on the remaining portions thereof. As shown in FIGS. 2B and 2C, substantially cylindrical posts, having a diameter of about 30 μm, for example, are preferably provided at the support positions 11.

The air-bridge sections 12 and 13 in the inductor 10 preferably have an electrode thickness of about 6 μm, for example. The skin depth of gold in the 2 GHz band is preferably $\delta s$=about 1.7 μm, for example, and the skin effect causes a current to flow so as to be concentrated at a subsurface area of each of the air-bridge sections 12 and 13.

The Q value of the inductor depends on the surface area of the inductor. The air-bridge sections 12 and 13 are connected in parallel and the total surface area of the air-bridge sections 12 and 13 is relatively large. Thus, the current branches into the air-bridge sections 12 and 13, and the concentration of the current caused by the skin effect is effectively controlled. An increase in the resistance between the terminal electrodes 6A and 6B caused by the skin effect is effectively controlled, and a high Q value of the inductor is maintained.

Since the air-bridge sections 12 and 13 are supported at the plurality of support locations 11, and the same corresponding locations of the air-bridge sections 12 and 13 are at the same or substantially the same potential, and no parasitic capacity occurs. If the air gap between the air-bridge sections 12 and 13 is set to be less than the size of each of the electrode width, the electrode thickness, and the diameter of the support post, no increase is caused in the parasitic capacity between the air-bridge sections 12 and 13. Since the air-bridge sections 12 and 13 are supported at the plurality of support locations 11, the structural strength of the air-bridge sections 12 and 13 is maintained.

A high Q value is obtained in the inductor without the need to increase the inner diameter of the spiral inductor and the electrode width. An increase in the area of the inductor is controlled and the inductor is miniaturized as compared to the case in which a high Q is obtained by increasing the inner diameter of the spiraling inductor and the electrode diameter.

In accordance with the first preferred embodiment of the present invention, the inductor element 7 has a spiral shape. The number of windings, the inner diameter, the electrode width, the electrode thickness, and the air gap may be modified in accordance with a required inductance value and dimensional requirements. The shape of the inductor may preferably be a polygonal line shape, a linear line shape, or other suitable shape, for example. The number of tiers of air-bridge sections is not limited to two. The number of tiers of air-bridge sections may preferably be three, four, or more, for example.

The substrate 1 is not limited to the gallium arsenide substrate. Any substrate may be used for the substrate 1 as long as the substrate can be thin-film processed. For example, the substrate 1 may be a silicon (Si) substrate, a high-resistance silicon substrate that is produced by performing a high-resistance process on a silicon substrate, a silicon dioxide ($SiO_2$) substrate, a glass substrate, or an aluminum oxide (alumina or sapphire) substrate. Alternatively, the resin layer 8 may not need to be provided.

Simulation tests performed to compare the Q value of the first preferred embodiment with the Q value of a comparative example are described below.

Figure 3A:
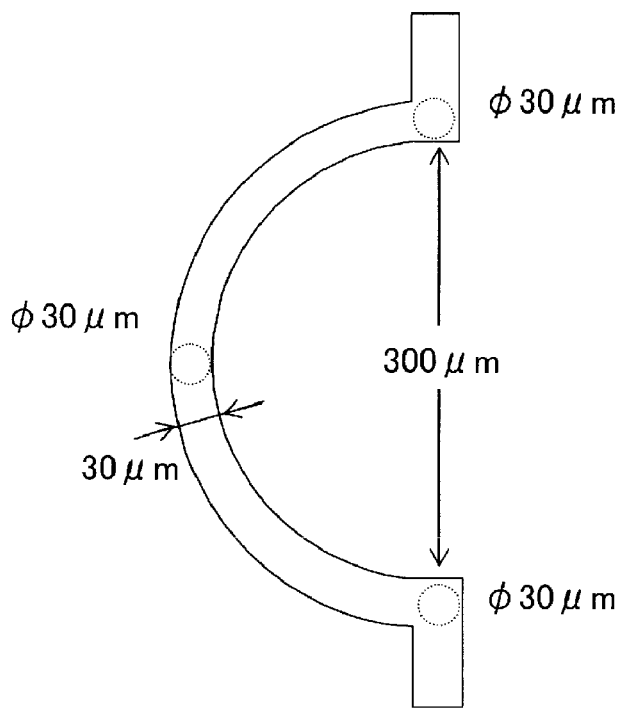
FIGS. 3A and 3B illustrate simulation test results of the inductor in accordance with the first preferred embodiment of the present invention.
Figure 3B:
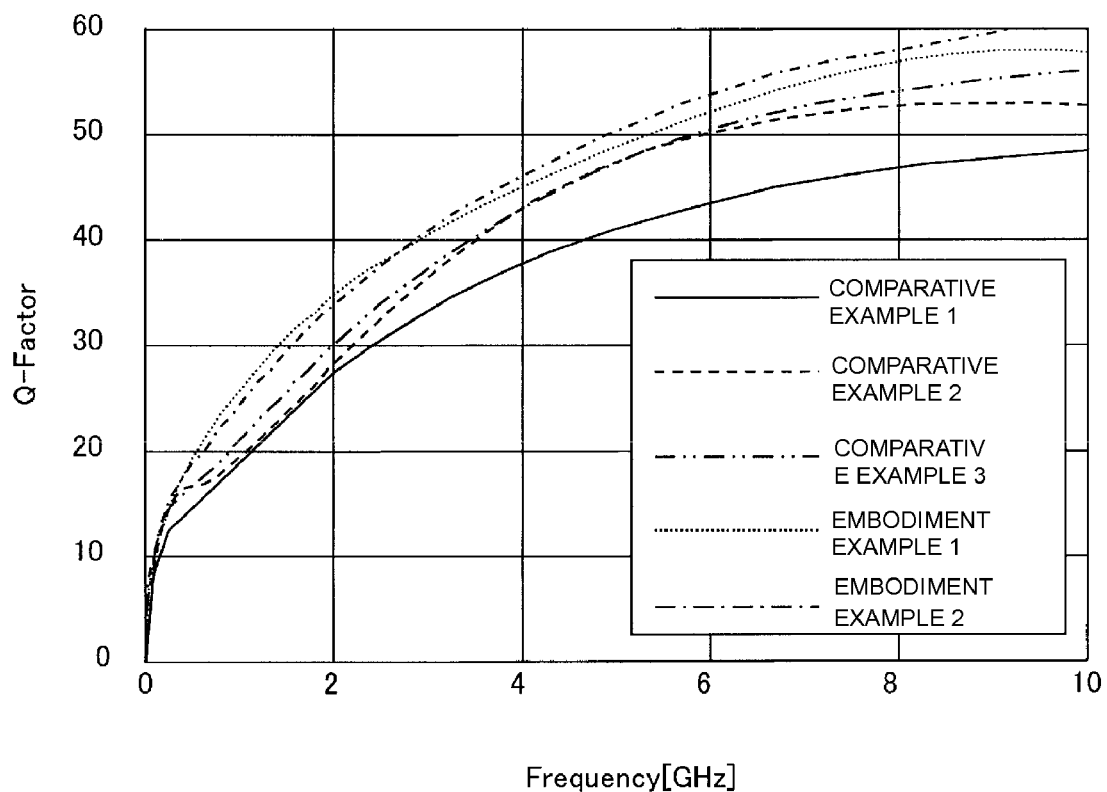

FIGS. 3A and 3B show simulation results related to the Q value. FIG. 3A is a top view of an inductor used in the simulation tests, and FIG. 3B illustrates frequency characteristics of the Q value of the same inductor.

In the simulation tests, the number of windings of the inductor is about 0.5, and the other settings remain unchanged from those of the first preferred embodiment.

The Q values of the following five examples were measured:

Comparative Example 1 single layer non-floating electrode (electrode thickness: about 6 μm)

Comparative Example 2 single layer air-bridge electrode (electrode thickness: about 6 μm)

Comparative Example 3 single layer air-bridge electrode (electrode thickness: about 12 μm)

Preferred Embodiment Example 1 dual layered air-bride electrodes (electrode thickness: about 6 μm)

Preferred Embodiment Example 2 triple layered air-bride electrodes (electrode thickness: about 6 μm)

The Q values on 2 GHZ as the simulation test results are as follows:

Comparative Example 1

Q=about 27

Comparative Example 2

Q=about 28

Comparative Example 3

Q=about 30

Preferred Embodiment Example 1

Q=about 35

Preferred Embodiment Example 2

Q=about 34

Examples 1 and 2 of preferred embodiments of the present invention provide the inductor Q value greater than the comparative examples by about 25%. Example 2 provides the inductor Q value greater than the comparative example 3, having the same cross-sectional area of the air-bridge electrode, by about 17%. The above simulation test results show that preferred embodiments of the present invention increase the Q value of the inductor.

A second preferred embodiment of the present invention is described below.

Figure 4A:
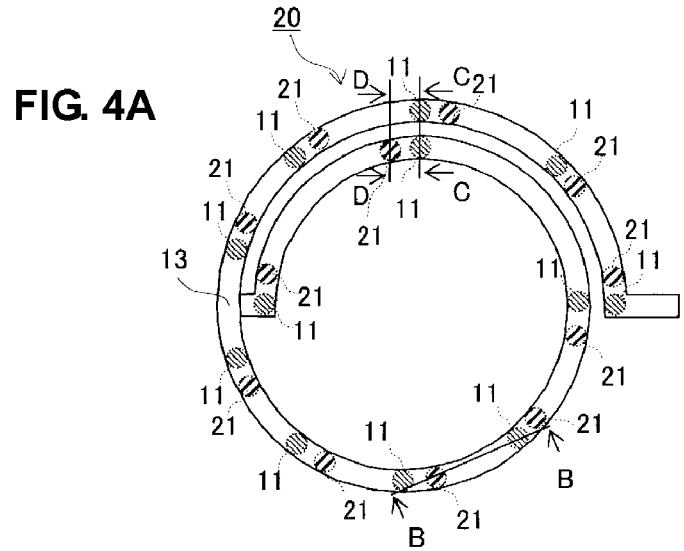
FIGS. 4A to 4D illustrate an inductor in accordance with a second preferred embodiment of the present invention.
Figure 4B:
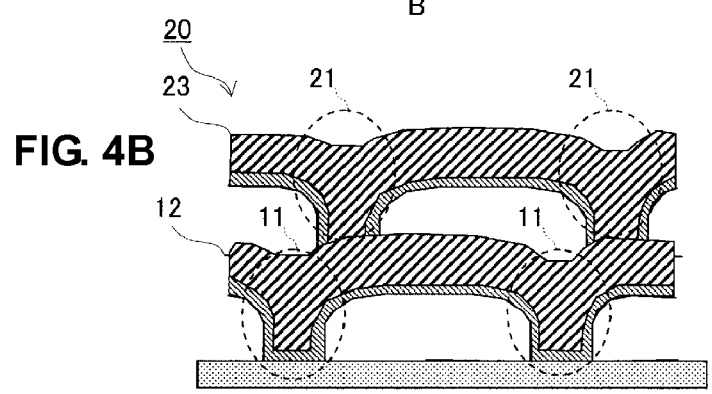
Figure 4C:
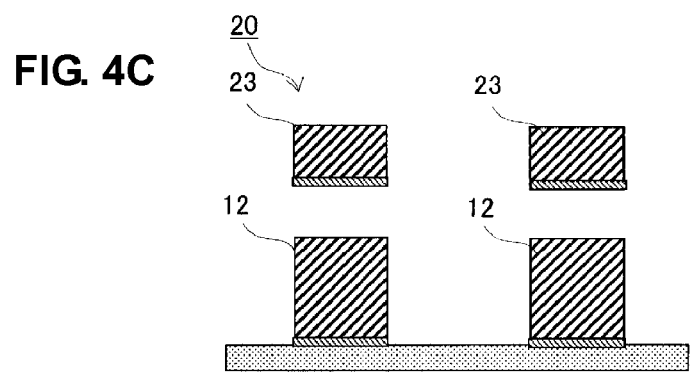
Figure 4D:
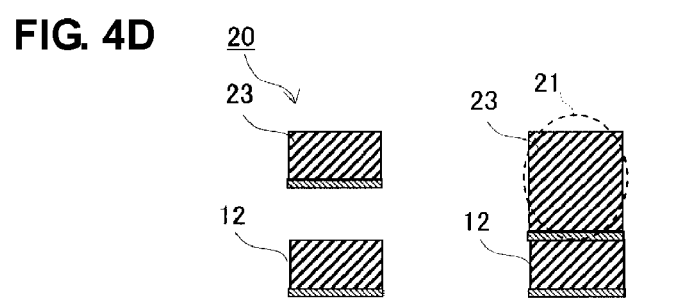

FIGS. 4A to 4D illustrate an inductor 20 in accordance with the second preferred embodiment of the present invention. FIG. 4A is a top view of the inductor 20, FIG. 4B is a cross-sectional view of the inductor 20 taken along line B-B in FIG. 4A, FIG. 4C is a cross-sectional view of the inductor 20 taken along line C-C in FIG. 4A, and FIG. 4D is a cross-sectional view of the inductor 20 taken along line D-D in FIG. 4A. Similar elements are designated with the same reference numerals and the discussion thereof is omitted.

In the inductor 20 of the second preferred embodiment of the present invention, the connection locations of an upper air-bridge section 23 to the lower air-bridge section 12 are different from the connection locations in the inductor 10 of the first preferred embodiment.

More specifically, the air-bridge section 23 has an electrode structure in which the air-bridge section 23 is electrically connected to the air-bridge section 12 at support locations 21, and floats at the other portions thereof from the air-bridge section 12. The support locations 21 are deviated from the support locations 11 of the air-bridge section 12. Substantially cylindrical posts, having a diameter of about 30 μm, for example, are provided at the support locations 21.

The inductor 20 is produced in the following general process including a plating process step.

Process step 1: A resist layer is formed on the substrate 1, and holes are formed at the support locations 11 through exposure and resist removal.

Process step 2: A plate electrode defining the air-bridge section 12 is formed on the resist and within the holes.

Process step 3: A resist layer is further formed on the plate electrode, and holes are formed at the support locations 21 through exposure and resist removal.

Process step 4: A plate electrode defining the air-bridge section 23 is formed on the resist layer and the within the holes.

With the above-described process, the air-bridge section 12 and the air-bridge section 23 of the inductor 20 are formed.

The top surface of the air-bridge section 12, corresponding to the support location 11, formed in process step 2 sags downward toward the substrate 1 as compared to the surrounding top surface area. The top surface of the air-bridge section 23, corresponding to the support location 21, formed in process step 4 sags downward toward the substrate 1 as compared to the surrounding top surface area. If the support location 11 and the support location 21 are not deviated from each other, the top surface of the air-bridge section 23 greatly sags, and the discontinuity of the electrode surface is increased. The electrode surfaces are close to each other at the sagging portion, a radiated electromagnetic field concentrates, and radiation loss increases. By deviating the support location 21 from the support location 11, the top surface of the air-bridge section 23 is substantially planarized, the radiation loss is reduced, and the inductor has a high Q value.

The hole is opened in the resist layer at the sagging portion of the top surface of the air-bridge section 12 during exposure in process step 3. The sagging of the top surface of the air-bridge section 12 can cause the focal distance during exposure to be shifted to underexposure or overexposure. Underexposure or overexposure can lead to a connection failure or a shortcircuit between the air-bridge section 12 and the air-bridge section 13. By deviating the support location 21 from the support location 11, the support location 21 is set on a substantially flat top surface of the air-bridge section 12. Thus, the problems described above are prevented.

Figure 5A:
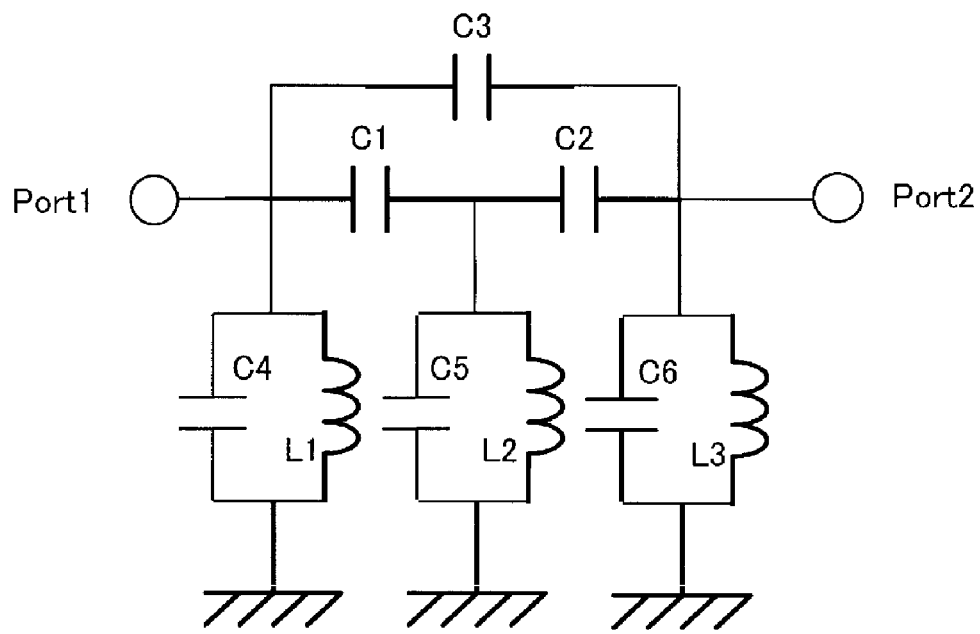
FIGS. 5A and 5B illustrate a filter in accordance with a third preferred embodiment of the present invention.
Figure 5B:
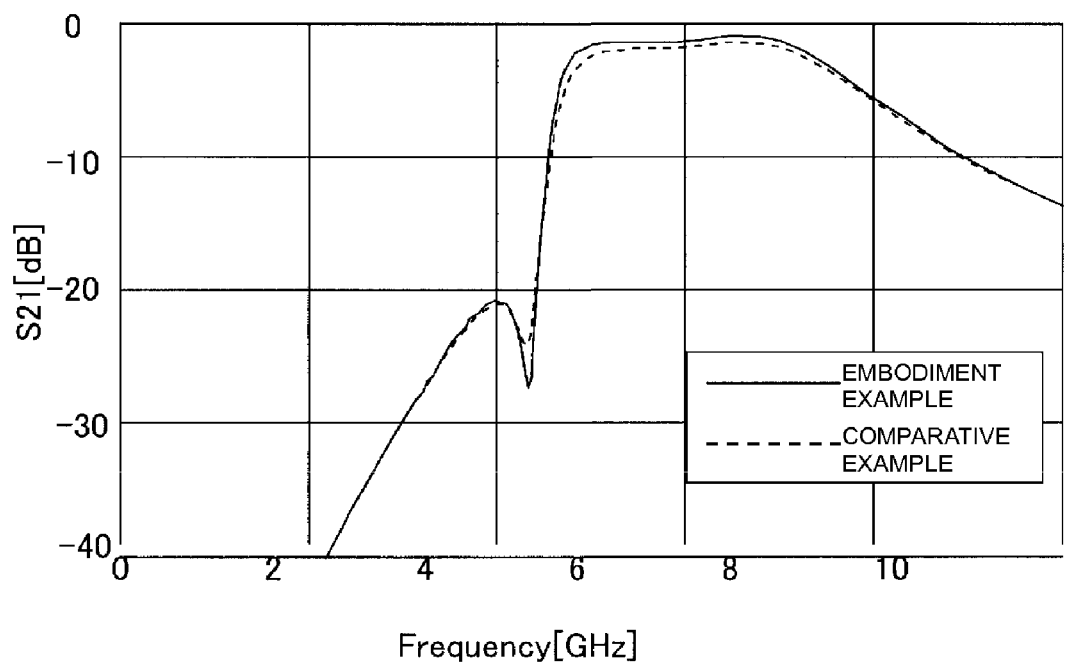

FIGS. 5A and 5B illustrates a filter in accordance with a third preferred embodiment of the present invention.

FIG. 5A is a circuit diagram of the filter of the third preferred embodiment of the present invention. FIG. 5B illustrates frequency characteristics of the filter.

The filter includes capacitances C1-C6 and inductances L1-L3. The capacitance C4 and the inductance L1 define an LC parallel resonance circuit at an input stage. The capacitance C5 and the inductance L3 define an LC parallel resonance circuit at an intermediate stage. The capacitance C6 and the inductance L3 define an LC parallel resonance circuit at an output stage. The LC parallel resonance circuit at the input stage is coupled with the LC parallel resonance circuit at the intermediate stage by a mutual capacitance C1. The LC parallel resonance circuit at the intermediate stage is coupled with the LC parallel resonance circuit at the output stage by a mutual capacitance C2. The LC parallel resonance circuit at the input stage is coupled with the LC parallel resonance circuit at the output stage by a skip coupling capacitance C3.

FIG. 5B illustrates simulation test results of filter passband characteristics S21. Referring to FIG. 5B, a solid line denotes test results of a high Q value inductor (Q=about 40) used for each of the inductances L1-L3 and a broken line denotes test results of a low Q value inductor (Q=about 30) as a comparative example used for each of the inductances L1-L3.

The filter including the high Q value inductor provides an insertion loss of about −1.51 dB at about 2.5 GHz, and an insertion loss of about −1.31 dB at about 2.7 GHz within the passband. The filter including the low Q value inductor provides an insertion loss of about −2.33 dB at about 2.5 GHz, and an insertion loss of about −1.83 dB at about 2.7 GHz within the passband. The test results show that the filter having the high Q value inductor has a smaller insertion loss. The example of a preferred embodiment of the present invention and the comparative example have substantially the same lower edge of the passband. It is thus verified that the filter having the high Q value inductor provides a high filter Q value.

Skip coupling between the resonance circuits at the input stage and the output stage in the filter creates an attenuation pole on the lower side region of the passband. The amount of attenuation of the attenuation pole (at about 2.17 GHz) is about −27.27 dB with the high Q value inductor and about −23.97 dB with the low Q value inductor. It is thus verified that the use of the high Q inductor increases a depth of attenuation.

The use of the inductor according to preferred embodiments of the present invention for each of the inductances L1-L3 in the filter reduces conductor loss in the inductances L1-L3. The insertion loss of the filter is thus effectively controlled.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An inductor comprising:
  a first air-bridge electrode extending between a plurality of support locations on a substrate so as to be floating above the substrate and including a to surface that sags downward towards the substrate at locations corresponding to the plurality of support locations; and
  a second air-bridge electrode extending between a plurality of support locations on the first air-bridge electrode so as to be floating above the first air-bridge electrode; wherein
  the plurality of support locations of the second air-bridge electrode are deviated from the plurality of support locations of the first air-bridge electrode.

2. The inductor according to claim 1, wherein each of the first air-bridge electrode and the second air-bridge electrode has a thickness greater than a skin depth at an operating frequency of the inductor.

3. The inductor according to claim 1, wherein the substrate includes a gallium arsenide semiconductor substrate.

4. A filter comprising the inductor according to claim 1.

* * * * *